United States Patent
Zhao et al.

(10) Patent No.: US 7,333,306 B2
(45) Date of Patent: Feb. 19, 2008

(54) MAGNETORESISTIVE SPIN VALVE SENSOR WITH TRI-LAYER FREE LAYER

(75) Inventors: Tong Zhao, Fremont, CA (US); Kunliang Zhang, Milpitas, CA (US); Hui-Chuan Wang, Pleasanton, CA (US); Yu-Hsia Chen, Mountain View, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 345 days.

(21) Appl. No.: 11/209,231

(22) Filed: Aug. 23, 2005

(65) Prior Publication Data

US 2007/0047159 A1 Mar. 1, 2007

(51) Int. Cl.
G11B 5/127 (2006.01)
G11B 5/33 (2006.01)

(52) U.S. Cl. ............... 360/324.12; 360/324; 360/324.1; 360/324.11; 29/603.05; 29/603.07; 29/603.12; 29/603.15; 428/811.2

(58) Field of Classification Search ........... 360/324.12, 360/324.1, 324.11; 29/603.05, 603.07, 603.12, 29/603.15; 428/811.2
See application file for complete search history.

(56) References Cited

U.S. PATENT DOCUMENTS

| | | | |
|---|---|---|---|
| 5,627,704 A | 5/1997 | Lederman et al. | 360/113 |
| 5,668,688 A | 9/1997 | Dykes et al. | 360/113 |
| 5,715,121 A | 2/1998 | Sakakima et al. | 360/113 |
| 5,896,252 A | 4/1999 | Kanai | 360/113 |
| 6,046,892 A | 4/2000 | Aoshima et al. | 360/113 |
| 6,101,072 A | 8/2000 | Hayashi | 360/324 |
| 6,338,899 B1 | 1/2002 | Fukuzawa et al. | 428/332 |
| 6,452,204 B1 | 9/2002 | Ishiwata et al. | 257/9 |
| 6,493,196 B1 | 12/2002 | Noma et al. | 360/324.11 |
| 6,714,388 B2 * | 3/2004 | Hasegawa et al. | 360/324.11 |
| 6,828,785 B2 | 12/2004 | Hosomi et al. | 324/252 |
| 6,829,161 B2 * | 12/2004 | Huai et al. | 365/158 |
| 6,831,312 B2 | 12/2004 | Slaughter et al. | 257/295 |
| 6,844,999 B2 | 1/2005 | Wang et al. | 360/324.12 |
| 7,141,314 B2 * | 11/2006 | Zhang et al. | 428/811.2 |

(Continued)

OTHER PUBLICATIONS

"Demonstrating a Tunneling Magneto-Resistive Read Head", Song et al., IEEE Trans. on Magnetics, vol. 36, No. 5, Sep. 2000, pp. 2545-2548.

(Continued)

Primary Examiner—Angel Castro
Assistant Examiner—Christopher R. Magee
(74) Attorney, Agent, or Firm—Saile Ackerman LLC; Stephen B. Ackerman

(57) ABSTRACT

A TMR sensor, a CPP GMR sensor and a CCP CPP GMR sensor all include a tri-layered free layer that is of the form CoFe/CoFeB/NiFe, where the atom percentage of Fe can vary between 5% and 90% and the atom percentage of B can vary between 5% and 30%. The sensors also include SyAP pinned layers which, in the case of the GMR sensors include at least one layer of CoFe laminated onto a thin layer of Cu. In the CCP CPP sensor, a layer of oxidized aluminum containing segregated particles of copper is formed between the spacer layer and the free layer. All three configurations exhibit extremely good values of coercivity, areal resistance, GMR ratio and magnetostriction.

34 Claims, 2 Drawing Sheets

U.S. PATENT DOCUMENTS 7,180,716 B2 * 2/2007 Li et al. ............... 360/324.12
7,268,982 B2 * 9/2007 Gill ...................... 360/324.11

OTHER PUBLICATIONS

"70% TMR at Room Temperature for SDT Sandwich Junctions With CoFeB as Free and Reference Layers," Wang et al., IEEE Trans. on Magnetics, vol. 40, No. 4, Jul. 2004, pp. 2269-2271.

"Low-Resistance Tunnel Magnetoresistive Head," Ohashi et al., IEEE Trans. on Magnetics, vol. 36, No. 5, Sep. 2000, pp. 2549-2553.

"Spin Dependent Tunnel Junctions for Memory and Read-Head Applications," Freitas et al., IEEE Trans. on Magnetics, vol. 36, No. 5, Sep. 2000, pp. 2796-2801.

"The Scalability of CPP-GMR Heads Toward Over 100 Gbpsi, Compared With TMR Heads", Takagishi et al., Toshiba TMRC 2001.

Co-pending U.S. Appl. No. 10/886,288, filed Jul. 7, 2004, "Improved Seed/AFM Combination for CPPGMR Device", Assigned to the Same Assignee.

Co-pending U.S. Appl. No. 11/180,808, filed Jul. 13, 2005, "CPP Structure With Enhanced GMR Ratios", Assigned to the Same Assignee.

* cited by examiner

MAGNETORESISTIVE SPIN VALVE SENSOR WITH TRI-LAYER FREE LAYER

BACKGROUND OF THE INVENTION

1. Field of the Invention

This invention relates generally to magnetoresistive read sensors and particularly to the free layer formations of such sensors operating in a tunneling magnetoresistive (TMR) configuration and current-perpendicular-to-plane GMR configurations.

2. Description of the Related Art

In simplest form, the usual giant magnetoresistive (GMR) read sensor consists of two magnetic layers, formed vertically above each other in a parallel planar configuration and separated by a conducting, but non-magnetic, spacer layer. Each magnetic layer is given a unidirectional magnetic moment within its plane and the relative orientations of the two planar magnetic moments determines the electrical resistance that is experienced by a current that passes from magnetic layer to magnetic layer through the spacer layer. The physical basis for the GMR effect is the fact that the conduction electrons are spin polarized by interaction with the magnetic moments of the magnetized layers. This polarization, in turn, affects their scattering properties within the layers and, consequently, results in changes in the resistance of the layered configuration. In effect, the configuration is a variable resistor that is controlled by the angle between the magnetizations.

The magnetic tunneling junction device (TMR device) is an alternative form of GMR sensor in which the relative orientation of the magnetic moments in the upper and lower magnetized layers (also called electrodes in this configuration) controls the flow of spin-polarized electrons tunneling through a very thin dielectric layer (the tunneling barrier layer) formed between those electrodes. When injected electrons pass through the upper electrode, as in the GMR device, they are spin polarized by interaction with the magnetization direction (direction of its magnetic moment) of that electrode. The probability of such an electron then tunneling through the intervening tunneling barrier layer into the lower electrode then depends on the availability of states within the lower electrode which the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer.

In what is called a spin-filter configuration, one of the two magnetic layers in both the GMR and TMR has its magnetization fixed in direction (the pinned layer), while the other layer (the free layer) has its magnetization free to move in response to an external magnetic stimulus. If the magnetization of the free layer is allowed to move continuously, as when it is acted on by a continuously varying external magnetic field, the GMR and TMR device each effectively acts as a variable resistor and it can be used as a read-head.

The difference in operation between the GMR sensor discussed first, and the TMR sensor just now discussed, is that the resistance variations in the former are a direct result of changes in the electrical resistance (due to spin polarized electron scattering) within the three-layer configuration (magnetic layer/non-magnetic, conducting layer/magnetic layer), whereas in the TMR sensor, the amount of current is controlled by the availability of states for electrons that tunnel through the dielectric barrier layer that is formed between the free and pinned layers.

When used as a read head, (called a TMR read head, or "tunneling magnetoresistive" read head) the free layer magnetization is moved by the influence of the external magnetic fields of a recorded medium, such as is produced by a moving hard disk or tape. As the free layer magnetization varies in direction, a sense current passing between the upper and lower electrodes and tunneling through the dielectric barrier layer varies in magnitude as more or less electron states become available. Thus a varying voltage appears across the electrodes. This voltage, in turn, is interpreted by external circuitry and converted into a representation of the information stored in the medium.

A typical spin-filter GMR sensor structure is the following:

Seed/Antiferromagnetic Layer/AP2/Ru/AP1/Cu/Free Layer/Capping Layer.

A typical spin-filter TMR sensor structure is the following:

Seed/Antiferromagnetic Layer/AP2/Ru/AP1/AlOx/Free Layer/Capping Layer,

In the TMR configuration shown above (and in the GMR as well), the seed layer is an underlayer required to form subsequent high quality magnetic layers. The antiferromagnetic layer is required to pin the pinned layer, ie., to fix the direction of its magnetic moment by exchange coupling. The pinned layer itself is now most often a synthetic antiferromagnetic (SyAF) (also termed a synthetic antiparallel (SyAP)) structure with zero total magnetic moment. This structure is achieved by forming an antiferromagnetically coupled tri-layer denoted as AP2/Ru/AP1, which is to say that two ferromagnetic layers, denoted AP1 and AP2, are magnetically coupled across a Ru spacer layer in such a way that their respective magnetic moments are mutually antiparallel and substantially cancel each other. The structure and function of such SyAP structures is well known in the art and will not be discussed in further detail herein. The conducting, but non-magnetic Cu spacer layer of the GMR is replaced in the TMR by (for example) a thin insulating layer of oxidized aluminum that can be oxidized in any of several different ways to produce an effective dielectric tunneling barrier layer. The free layer in both the GMR and TMR is usually a bilayer of ferromagnetic material such as CoFe/NiFe, and the capping layer in both the GMR and TMR is typically a layer of tantalum (Ta). The bilayer choice for the free layer is necessitated by the fact that an effective free layer should be magnetically soft (of low coercivity), which is an attribute of the NiFe layer, yet it must also be an effective spin polarizer of conduction electrons, which is an attribute of the CoFe layer. We shall see below that the structure of the free layer can be significantly altered to provide an improved GMR or TMR sensor.

Superficially, the TMR structure differs from the GMR configuration by the replacement of a conducting Cu spacer layer in the GMR with an oxidized aluminum (AlOx) tunneling barrier layer in the TMR. Although this seems to be a minor substitution, the physical basis of the operation of the two structures is substantially different and, in addition, the dimensions of the various layers are also quite different.

The advantage of the TMR configuration compared to the GMR configuration is that the TMR configuration has a higher MR ratio, dR/R, (ratio of maximum resistance variation as the free layer magnetic moment changes direction, dR, to total device resistance, R), which is a measure of its efficacy as a read sensor. For example, while typical GMR ratios of GMR read sensors are less than 10%, ratios on the order of 70% have been reported for tunneling junction configurations used as MRAM devices rather than as read head sensors. The present invention will show a read head TMR sensor with a MR ratio on the order of 30%. In addition, the TMR sensor is operated in a CPP (current perpendicular to plane) mode, since it is required that the electrons tunnel through the barrier layer from the pinned layer to the free layer. GMR sensors, on the other hand, can operate either in the CPP mode or in the CIP (current in plane) mode, wherein electrons move laterally through the pinned/spacer/free layer configuration.

The CPP mode required of the TMR sensor increases overall sensor resistance, R, as the sensor layers are scaled down and made narrower and thinner to better enable their use in reading high density recorded media. To maintain a useful sensor resistance range, the thickness of the AlOx has to be reduced to less than 7 angstroms to achieve a low areal resistance, RA, in the range of approximately several ohm-$\mu m^2$. As a consequence, of the decreasing RA, the MR ratio of the sensor also decreases. Thus, one of the major challenges for the design of TMR sensors is to improve the MR ratio while keeping RA low.

Much recent experimentation on GMR sensors has been directed at improvements in the free layer structure. The most common structure in both the GMR and TMR sensor had been a CoFe/NiFe bilayer, in which the NiFe layer provides the required softness, while the CoFe provides good spin polarization of conduction electrons. More recently, work has been done on improving the magnetic properties of both free and pinned layers by utilizing novel materials and laminated structures. Most notable of the novel materials has been CoFeB, an alloy of cobalt, iron and boron. Noma et al. (U.S. Pat. No. 6,493,196) teach a pinned layer formed as a tri-layer of NiFe/CoFeB/CoFe and Hosami et al. (U.S. Pat. No. 6,828,785) disclose a laminated free layer of CoFe, NiFe and CoFeB. Aoshima et al. (U.S. Pat. No. 6,046,892) show a free layer of CoFeB/NiFe and the present inventors, in Wang et al. (U.S. Pat. No. 6,844,999) teach a boron-doped (CoFeB) free layer. In fact, the use of a CoFeB free layer is taught in several patents, including Slaughter et al (U.S. Pat. No. 6,831,312), Fukuzawa et al. (U.S. Pat. No. 6,338,899) and Hayashi (U.S. Pat. No. 6,101,072). Slaughter, in particular, suggests that the amorphous nature of CoFeB is advantageous in a tunneling junction type sensor because it increases the smoothness of various layers and generally enhances the sensor's magnetic performance.

The present inventors have been investigating possible ways of improving the free layer structure for both a GMR and a TMR sensor. In the TMR sensor, the function of the free layer and the constraints placed upon the free layer are different than those in the GMR sensor and it is not necessarily true that free layer structures that are advantageously used in the GMR sensor will have similar benefits in the TMR sensor. To achieve a high MR ratio, the growth process of the barrier layer must produce a layer of great smoothness and the process by which it is oxidized must be exceptionally well controlled. In addition, the nature of the magnetic structures on either side of the barrier layer, namely the AP1 layer of the pinned layer and the contiguous portion of the free layer are also extremely important. In fact, it will be an object of the present invention to produce a free layer, suitable for both CPP configuration GMR sensors and TMR sensors that will enhance their respective MR ratios, while maintaining good magnetic softness (low coercivity) and providing an adjustable magnetostriction.

SUMMARY OF THE INVENTION

A first object of this invention is to provide a method of forming a TMR sensor that combines a high MR ratio, low free layer coercivity and a low areal resistance (RA).

A second object of the present invention is to provide a method of forming a TMR sensor that allows adjustment of its magnetostriction properties.

A third object of the present invention is to provide a method of forming a GMR sensor having a CPP configuration or a CCP CPP configuration and a low free layer coercivity, high GMR ratio and a low areal resistance.

A fourth object of the present invention is to provide a method of forming a GMR sensor having a CPP configuration or a CCP CPP configuration that allows adjustment of its magnetostriction properties.

These objects will be met by the formation within both the CPP and CCP CPP configured GMR sensor and the TMR sensors of a novel tri-layered free layer having the structure:

CPP structure: CoFe(25%)/CoFeB/NiFe(10%)

TMR structure: CoFe(70%)/CoFeB/NiFe(10%), where percentages refer to Fe atom percent.

This structure has demonstrated outstanding magnetic softness (low coercivity) and low magnetostriction.

When formed within the CPP GMR spin valve, this free layer has produced a dR/R of 9.8% and a small areal resistance of only 0.17 ohm-micron$^2$ squared in a structure having a cross-sectional area of approximately 0.05 micron$^2$. This is a significant improvement over more conventional CPP structures.

In the TMR sensor, the same tri-layered structure is used, with the CoFe layer being formed to a thickness between approximately 2 and 30 angstroms, the CoFeB layer (which may be alloyed with other elements such as Ni) being formed to a thickness range between approximately 5 and 40 angstroms and the NiFe layer being formed to a thickness between approximately 5 and 80 angstroms. It is to be noted that much higher MR ratios, up to approximately 30%, can be obtained in the TMR sensor and, when formed with a horizontal circular cross-sectional shape of approximately 0.6 microns diameter, the sensor produced an areal resistance of 4.0 ohm-micron$^2$.

The TMR Structure.

CoFeB is a promising candidate for inclusion into a TMR free layer since its use in MRAM structures has produced a very high MR of up to 70% (see Dexin Wang et al.: "70% TMR at Room Temperature for SDT Sandwich Junctions with CoFeB as Free and Reference Layers," IEEE Transactions On Magnetics, Vol. 40, No. 4, 2004, p. 2269)

However, when the CoFeB material is introduced into the free layer of a low RA TMR structure (as opposed to an MRAM type structure) the MR ratio becomes even lower than the typical CoFe/NiFe. Table 1, below shows the measured properties of four sample TMR devices with different free layers and tunnel barrier layers. Each sample has a horizontal circular cross-section of diameter 0.6 microns and the same generic structure:

Seed Layer/AF pinning layer/CoFe/Ru/CoFeB/Al/NOX/ Free Layer/Capping Layer

TABLE 1

| Sample | Structure | dR/R | RA($\Omega\mu m^2$) | $H_c$ (Oe) |
|---|---|---|---|---|
| 1 | Al = 5.75, FL = CoFe(70%)10/NiFe(10%)40 | 22.4% | 4.6 | 4.7 |
| 2 | Al = 5.75, FL = CoFe(20%)B(20%)19/NiFe(10%)40 | 18.1% | 4.6 | 3.4 |
| 3 | Al = 5.0, FL = CoFe(70%)10/NiFe(10%)40 | 25.4% | 4.0 | 4.7 |
| 4 | Al = 5.0, FL = CoFe(70%)10/CoFe(20%)B(20%)10/NiFe(10%)40 | 30.1% | 4.0 | 5.0 |

Notation in the table above is as follows: Al=5.75 denotes a 5.75 angstrom thick layer of Al to be oxidized by a process of natural oxidation (NOX). CoFe(70%)10/ denotes a 10 angstrom thick layer of CoFe with Fe 70% by number of atoms. $H_c$ denotes the coercivity of the free layer. The unit of coercivity is Oersteds (Oe) and the unit of areal resistance (RA) is $\Omega\mu m^2$ (ohms times square microns).

As can be seen from the properties of samples 1 and 2, the replacement of the CoFe layer in sample 1 by the CoFeB layer in sample 2 actually lowers the MR from 22.4 to 18.1, which is not a good result. Comparing sample 3 to sample 4, however, shows how the problem has been solved by including the CoFe(20%)B(20%) layer within a tri-layer, wherein that CoFeB layer is sandwiched between CoFe and NiFe layers. The tri-layered configuration of sample 4 has a higher MR than the bi-layered configuration of sample 3. It is the opinion of the inventors that the improvement in MR ratio that results from the tri-layering of the CoFeB results from the fact that the CoFeB is no longer in direct contact with the oxidized Al layer and there is no interdiffusion between the CoFeB and the oxidized Al. It is to be noted that although CoFe(20%)B(20%), with the percentage of B atoms being 20% and the percentage of Fe atoms being 20% has been preferred herein, values of Fe between 5%-90% and B between 5%-30% fulfill the objects of the invention. When oxidized Al is used in a TMR read head application, as in the present invention, the formation of a thin barrier is most easily accomplished by using a relatively weak method of oxidation, such as natural oxidation (simply allowing the deposited Al layer to come in contact with oxygen in an oxidation chamber). This process is easily controlled and allows us to maintain a low RA. As a result of natural oxidation, however, the oxidized Al layer is formed in a so-called under-oxidized state, in which interdiffusion between it and the contiguous free layer occurs easily. In the formation of an MRAM element, however, the Al layer is fully oxidized by means of radical shower oxidation (a bombardment of the Al layer with energetic oxygen radicals) or by plasma oxidation (a similar contact between the Al layer and energetic particles). In those cases, the interdiffusion is not the problem it is in sensor formation. A similar problem occurs when CoFeB is used as the AP1 layer in the antiferromagnetically coupled pinned layer. Thus, to eliminate the interdiffusion problem, we place a CoFe layer between the CoFeB and the oxidized Al barrier layer. As can be seen from the table, sample 4, which uses the tri-layer, is a significant improvement over the other sample free layer structures and shows a 20% gain in MR over the reference structure, sample 3. Finally, it is to be noted that the magnetostriction of the free layer can be controlled during its formation by varying the composition or thickness of the NiFe layer or the other two layers.

The GMR Structure.

When used in a CPP configured GMR rather than the TMR described above, the tri-layer free layer is formed within two different sensor configurations, the more usual CPP configuration and a "confined current path" or CCP-CPP configuration.

In the former configuration, the general structure and placement of active layers is:

Seed/AFM pinning/AP2/Ru/[CoFe_Cu]/Cu 30/[CoFe/NiFe]/cap,

Where CoFe_Cu denotes a layer of Cu laminated onto the CoFe to increase the interfacial scattering of conduction electrons.

In this configuration the AFM pinning layer is a layer of antiferromagnetic material that is exchange coupled to the SyAP pinned layer. The SyAP pinned layer is a tri-layer of a ferromagnetic material, denoted simply AP2, a Ru coupling layer and a second ferromagnetic layer (normally denoted AP1), that is here formed as a layer of CoFe laminated onto on a thin layer of Cu. The pinned layer is separated from the free layer by a Cu spacer layer approximately 30 angstroms in thickness and a composite CoFe/NiFe bilayer forms the free layer.

In a CCP-CPP configuration, as described by Sakakima et al. (U.S. Pat. No. 5,715,121), an additional CCP structure is inserted between AP1 and the free layer, as follows:

[Ta/Ru]seed/AFM pinning/AP2/Ru/[CoFe_Cu]/Cu/CCP-layer/Cu/[CoFe/NiFe]/cap

The CCP layer in this structure is a layer formed of conducting particles segregated within an insulating material, so that the particles form a conducting pathway. In the following preferred embodiment, Cu particles segregated within a layer of oxidized aluminum will be used as the CCP layer, but other combinations of segregated particles of conducting material within a dielectric matrix will also form a CCP layer.

In either of the two cases shown above, the AP1 and AP2 layers are in the thickness range between approximately 20-50 angstroms and the free layer thickness is in the thickness range between approximately 30-60 angstroms. For read head applications, the free layer should have a small coercivity, $H_c$, of less than 10 Oe and a low magnetostriction in the order of between $10^{-8}$ and $10^{-6}$ to reduce stress induced anisotropy. In addition, the sensor configuration must have a sufficiently high CPP GMR ratio. A composite CoFe(10%)/NiFe(17.5%) is commonly used because of a small $H_c$ of approximately 5 Oe and a low magnetostriction of approximately $2\times10^{-6}$. Its CPP GMR ratio, dR/R, however, is not large enough and must be improved.

It is known that the CPP GMR ratio depends greatly on the spin polarization properties of the AP1 and the free layer materials. Typically, the greater the degree of spin polarization of conduction electrons, the higher the GMR ratio. In bulk Co(100-x)Fe(x) alloys, the spin polarization property usually increases with increasing value of x (a percentage), the Fe content in atom percent. Therefore, it might be expected that the GMR ratio will be higher with Co(100-x)Fe(x) layers, with x>10%, used in the AP1 and free layers.

The inventors have already demonstrated that an AP1 layer having x=50% significantly improves upon a layer having x=10%, increasing the resulting GMR ratio by between 15% and 20%. Similarly, with a free layer of [CoFe(25%) 10/NiFe(17.5%) 35] replacing a free layer of [CoFe(10%) 12/NiFe(17.5%) 35], the GMR ratio gains between approximately 10% and 15% with a similar RA. We have also demonstrated that replacing the already improved CoFe (50%) AP1 layer by a CoFe(70%) AP1 layer, which is a choice made in forming the preferred embodiment, there is an additional 12% GMR ratio improvement. Therefore, it seems clear that CoFe alloys richer in Fe, very effectively enhance GMR ratios.

We have also demonstrated that a composite free layer of [CoFe(25%) 20/NiFe(10%) 28] produces the best dR/R with a comparable $H_c$ and magnetostriction. This comparison data is shown in Table 2 below. This particular combination is unique since the magnetic moment of NiFe(10%) is very small and its magnetostriction is negative, while the magnetic moment of CoFe(25%) is only slightly larger than that of CoFe(10%) and its magnetostriction is slightly positive. As a result, the [CoFe(25%)/NiFe(10%)] composite free layer will allow the maximum contribution from the bulk scattering properties of the CoFe(25%) while maintaining free layer softness (low $H_c$) and small magnetostricition.

Furthermore, we observed that with a thin CoFe(20%)B (20%) layer inserted between the interface of the CoFe (25%) and NiFe(10%) layers, the CPP dR/R shows additional gain of approximately 10% even with a reduction of RA (areal resistance). The inventors believe that the CoFeB contributes to the interfacial scattering, which is more important in producing the CPP GMR improvement than in producing the TMR improvement. Our reasoning is as follows. CoFeB has a very large coefficient of spin polarization. When the CoFeB layer is combined with a high spin polarization BCC (crystalline) layer of CoFe(25%), the total spin polarization is enhanced. Some of these results are also shown in Table 2 below. Overall, comparing this new tri-layered free layer with the conventional free layer, the dR/R improvement is significant. We believe that the additional dR/R improvement is a result of an enhancement of interfacial scattering as well as bulk scattering due to the intrinsically high spin polarization produced by the CoFeB layer as noted above.

In Table 2 below, the seed layer for all 4 sample structures is Ta/NiCr. The antiferromagnetic pinning layer is IrMn. AP2 is CoFe(25%), AP1 is CoFe(70%) laminated onto a thin Cu layer, ie. [CoFe_Cu] and formed to a thickness of 36 angstroms. Each sample includes a CCP layer that is a layer of AlCu formed between two Cu layers in a configuration of the form Cu/AlCu/Cu in which the first Cu layer is approximately 5.2 angstroms in thickness, the AlCu CCP layer is approximately 8.5 angstroms in thickness and the final Cu layer is approximately 3 angstroms in thickness. To form the CCP layer, the Al is oxidized and the Cu becomes a segregated metal path within the resulting AlOx, using a combined process of RF-PIT and RF-IAO (which are, respectively, plasma assisted ion and argon/oxygen ion processes). Within the table, an expression such as CoFe (25%)20 indicates a layer of CoFe formed to a thickness of 20 angstroms and being 25% Fe by number of atoms.

TABLE 2

| Sample | Free Layer | RA(Ωμm$^2$) | dR/R | $H_c$ | Lambda |
|---|---|---|---|---|---|
| 1 | CoFe(10%) 12/NiFe(17.5%) 35 | 0.25 | 8% | 4.3 Oe | $2.00 \times 10^{-6}$ |
| 2 | CoFe(25%) 10/NiFe(17.5%) 35 | 0.25 | 8.8% | 4.5 Oe | $2.30 \times 10^{-6}$ |
| 3 | CoFe(25%) 20/NiFe(10%) 28 | 0.2 | 9.23% | 4.9 Oe | $7.00 \times 10^{-8}$ |
| 4 | CoFe(25%) 12/CoFe (20%)B(20%) 10/NiFe(10%) 35 | 0.17 | 9.8% | 4.2 Oe | $1.00 \times 10^{-6}$ |

It should be noted in Table 2 above that the use of CoFe (25%) can be replaced by CoFe(50%) or CoFe(70%) and similarly for CoFe(20%)B(20%) and NiFe(10%), with appropriate changes in the other atom percents. It should also be noted that sample 4 in the table above produces exceptional values of areal resistance, MR ratio, coercivity and "lambda," which is the coefficient of magnetostriction. Finally, it should be noted that while the tri-layer free layer of sample 4 constitutes a preferred embodiment, the tri-layer can be repeated to form a multi-layered laminated free layer that will also meet the objects of the present invention.

DESCRIPTION OF THE PREFERRED EMBODIMENTS

The first preferred embodiment of the present invention is a TMR sensor structure of improved areal resistance, improved free layer coercivity, improved magnetoresistive ratio (dR/R) and improved magnetostriction qualities. This improvement is obtained by the introduction of a tri-layer free layer comprising a CoFeB layer interposed between CoFe and NiFe layers.

Figure 1:
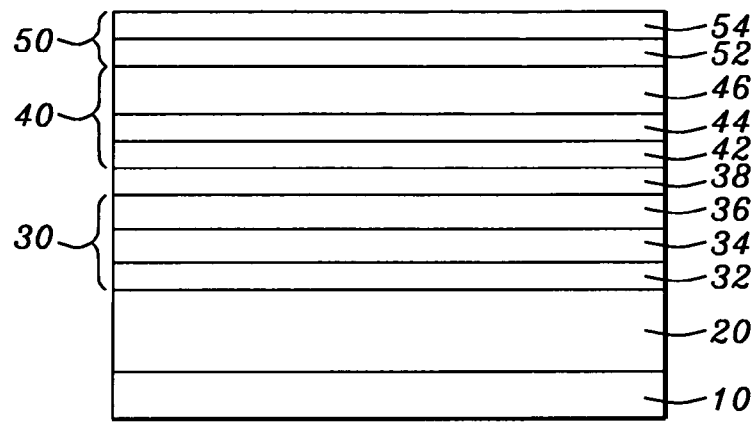
FIG. 1 is a schematic representation of a spin-valve TMR sensor utilizing the tri-layered free layer of the present invention.

Referring first to FIG. 1, there is shown in schematic form a cross-sectional view through a vertical plane of a TMR sensor stack with conduction lead layers and magnetic biasing layers not illustrated. It is understood that the layers in the stack are most typically formed by a process of sputtering from appropriate targets, with the exception of layers that require additional processing as will be noted. Looking at the layered structure from the bottom to the top, there is shown first a seed layer (10), which can be a layer of Ta/NiCr with the Ta formed to a thickness between approximately 5 and 30 angstroms, with 20 angstroms being preferred and the NiCr formed to a thickness between approximately 30 and 80 angstroms with 50 angstroms being preferred.

On the seed layer is then formed a pinning layer (20) of an antiferromagnetic material such as a layer of IrMn formed to a thickness between approximately 40 and 100 angstroms with 70 angstroms being preferred.

On the pinning layer there is then formed a pinned layer (30), which in this preferred embodiment is a SyAP tri-layer comprising two ferromagnetic layers (32), (36) separated by an antiferromagnetically coupling layer (34). A proper choice of material and thickness of the ferromagnetic layers and the coupling layer allows the magnetic moments of the ferromagnetic layers to align themselves in antiparallel directions, thus reducing the net magnetic moment of the tri-layer to essentially zero, while the pinning layer fixes the magnetic moment direction of the layer (32). In the present embodiment, layers (32) and (36) can both be layers of CoFe(25%) formed to thicknesses between approximately 10 and 50 angstroms with 20 angstroms being preferred, while layer (34) can be a layer of Ru formed to a thickness between approximately 7 and 8 angstroms with 7.5 angstroms being preferred.

On the SyAP tri-layer there is then formed a tunneling barrier layer (38) which is preferentially a layer of Al, formed to a thickness between approximately 4 and 8 angstroms with 5 angstroms being preferred, which is then naturally oxidized to form a layer of AlOx. The oxidation process preferentially takes place in an oxidation chamber in which oxygen gas is fed in at a rate of 10-2000 sccm. The process of natural oxidation, is preferred over plasma assisted oxidation or radical shower oxidation when producing the very thin tunneling barrier layers that are preferred in the present invention.

On the oxidized Al tunneling barrier layer there is then formed a tri-layer free layer (40), comprising layers (42), (44) and (46). Layer (42), which contacts the barrier layer, is preferentially a layer of CoFe (70%) formed to a thickness between approximately 2 and 30 angstroms with approximately 10 angstroms being preferred. It is to be noted that other elements, such as Ni, may be alloyed into the CoFe alloy and still achieve the objects of the invention. Layer (44) is preferably a layer of CoFe(20%)B(20%), but an alloy in which the atom percent of Fe ranges between approximately 5%-90% and the atom percent of B ranges correspondingly between approximately 5%-30% is acceptable and will meet the objects of this invention. The CoFeB is formed to a thickness between approximately 5 and 40 angstroms, with approximately 10 angstroms being preferred. This CoFeB layer, too, may be alloyed with other elements, such as Ni, Nb or Zr. Layer (46) is a layer of NiFe (10%) formed to a thickness between 5 and 80 angstroms with approximately 40 angstroms being preferred. This layer can be alloyed with other materials, such as Co, B, Nb or Zr. Again, it must also be noted that, in addition to the tri-layered free layer just described, multiple laminations of the magnetic layers (42), (44) and (46) can be formed into a composite free layer and still meet the objects of the invention. The composite multi-layered free layer, of which the tri-layer is exemplary of the preferred embodiments described herein, can be equally well formed within the second and third embodiments described below.

On the tri-layered free layer (or a composite free multi-layer) there is then formed a capping layer (50) which can be a bilayer of Ta/Ru, in which the Ta layer (52) can be formed to a thickness between approximately 5 and 100 angstroms and the Ru layer (54) can be formed to a thickness between approximately 5 and 200 angstroms.

It is to be noted that the magnetostriction qualities of the sensor, as measured by the coefficient of magnetostriction, lambda, can be controlled during fabrication by varying the thicknesses of the three layers that comprise the free layer.

The second preferred embodiment of the present invention is a CCP CPP GMR (confining current path-current perpendicular to the plane-giant magnetoresistive) sensor structure of improved areal resistance, improved free layer coercivity, improved magnetoresistive ratio (dR/R) and improved magnetostriction qualities. These improvements are obtained by the introduction of a tri-layer free layer comprising a CoFeB layer interposed between CoFe and NiFe layers.

Figure 2:
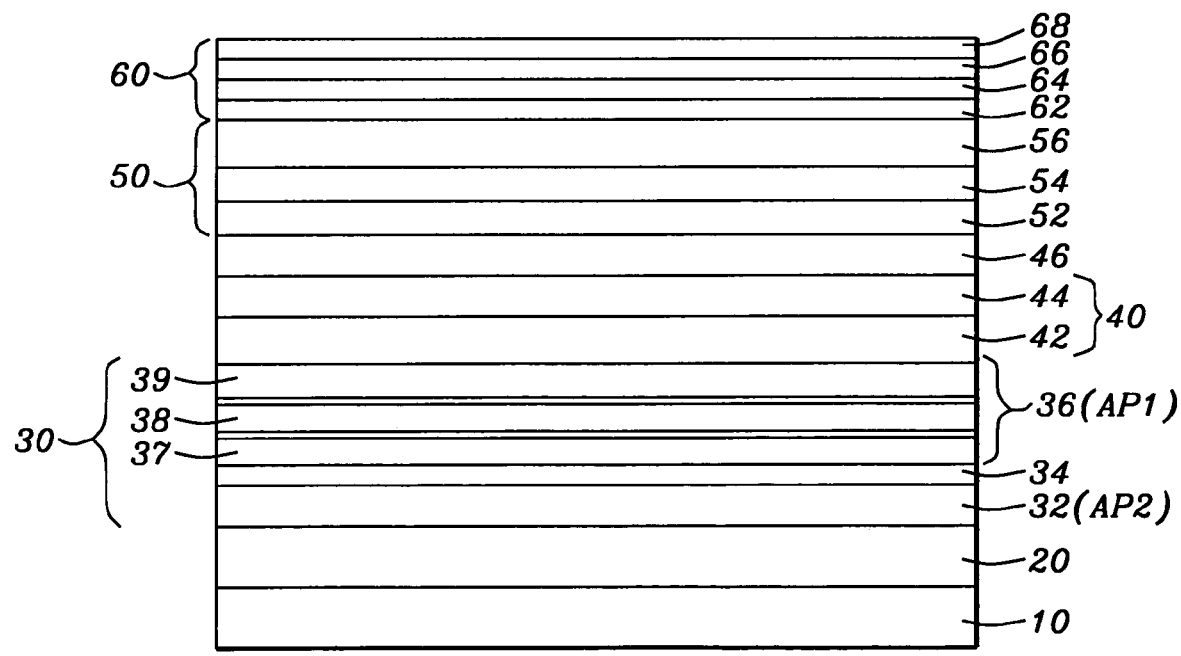
FIG. 2 is a schematic representation of a spin-valve GMR sensor formed in the CCP-CPP configuration and using the tri-layered free layer of the present invention.

Referring now to FIG. 2, there is shown in schematic form a cross-sectional view of a CCP-CPP GMR sensor stack with conduction lead layers and magnetic biasing layers not illustrated. It is understood that the layers in the stack are most typically formed by a process of sputtering from appropriate targets, unless a particular processing step is noted. Looking at the layered structure from the bottom to the top, there is shown first a seed layer (10), which can be a layer of Ta/NiCr with the Ta formed to a thickness between approximately 10 and 60 angstroms, with 50 angstroms being preferred and the NiCr formed to a thickness between approximately 10 and 40 angstroms with 20 angstroms being preferred.

On the seed layer is then formed a pinning layer (20) of an antiferromagnetic material such as a layer of IrMn formed to a thickness between approximately 45 and 100 angstroms with 70 angstroms being preferred.

On the pinning layer there is then formed a pinned layer (30), which in this preferred embodiment is a SyAP tri-layer comprising two ferromagnetic layers (32) and (36), denoted AP2 and AP1 respectively, separated by an antiferromagnetically coupling layer (34). A proper choice of material and thickness of the ferromagnetic layers and the coupling layer allows the magnetic moments of the ferromagnetic layers to align themselves in antiparallel directions, thus reducing the net magnetic moment of the tri-layer to essentially zero, while the pinning layer fixes the magnetic moment direction of the AP2 layer (32). In the present embodiment, layer (32) can be a layer of CoFe(25%) formed to a thickness between approximately 15 and 60 angstroms with approximately 46 angstroms being preferred, while layer (34) can be a layer of Ru formed to a thickness between approximately 7 and 8 angstroms with 7.5 angstroms being preferred. Preferably in the present invention, AP1 layer (36) is a tri-layer comprising a first pair, (37) & (38) of sequentially formed identical layers, each layer being itself a laminated bilayer comprising a layer of CoFe(70%), of thickness between approximately 5 and 15 angstroms with approximately 12 angstroms being preferred, laminated to a thin layer of Cu of thickness between approximately 0.5 and 5 angstroms, with approximately 2 angstroms being preferred. The thin, laminated Cu layer (indicated by a horizontal line) is found to improve interfacial scattering of conduction electrons and to, thereby, enhance sensor performance. Upon this first pair, (37)&(38), is then laminated a third layer (39), which is a layer of CoFe(70%) formed to a thickness between approximately 5 and 15 angstroms with approximately 12 angstroms being preferred. The entire triply laminated AP1 layer thereby has the following form: [CoFe(70%)_Cu][CoFe(70%)_Cu]CoFe(70%).

On the laminated AP1 layer there is then formed a combined spacer layer and CCP layer (40). This structure comprises a first Cu spacer layer (42), which in this embodiment is a layer of Cu formed to a thickness between approximately 2 and 8 angstroms, with approximately 5.2 angstroms being preferred. Upon this first spacer layer is then formed the CCP layer (44), which is preferentially an initially formed bilayer of Al/Cu (other combinations being possible), formed to a thickness between approximately 3 and 12 angstroms with approximately 8.5 angstroms being preferred, which is then processed to form a layer of AlOx within which are segregated particles of Cu that form a conducting pathway. The oxidation and segregation process preferentially comprises a first RF PIT process followed by a second RF IAO process. The RF PIT process requires (20 W 50 sccm 40 s). The RF IAO process requires an Ar/O mixture at a ratio of 50/0.8 at 27 W. It is noted that Al/Cu can be replaced by other combinations in which one layer is oxidized and the other layer is segregated.

Following the formation of the CCP layer, a second conducting, non-magnetic spacer layer is formed (46) which is a layer of Cu formed to a thickness between approximately 1 and 5 angstroms with approximately 3 angstroms being preferred.

On the second spacer layer there is then formed a tri-layer (or multi-layered) composite free layer (50), comprising layers (52), (54) and (56). Layer (52), which contacts the second spacer layer, is preferentially a layer of CoFe (25%) formed to a thickness between approximately 5 and 30 angstroms with approximately 12 angstroms being preferred. It is to be noted that other elements, such as Ni, Nb, and Zr may be alloyed into the CoFe alloy and still achieve the objects of the invention. Layer (54) is a layer of CoFe(20%)B(20%), formed to a thickness between approximately 5 and 40 angstroms, with approximately 10 angstroms being preferred. The percentages of Fe may range between approximately 5% and 90% and the percentages of B may range between approximately 5% and 30% and still meet the objects of the invention. This layer, too, may be alloyed with other elements, such as Ni, Nb and Zr. Layer (56) is a layer of NiFe (10%) formed to a thickness between 5 and 80 angstroms with approximately 35 angstroms being preferred. This layer can be alloyed with other materials, such as Co, Nb, Zr and B.

On the tri-layered free layer there is then formed a capping layer (60) which can be a four layer composite layer of Cu 30/Ru 10/Ta 60/Ru 10, in which the Cu layer (62) is formed to a thickness between approximately 5 and 50 angstroms with approximately 30 angstroms being preferred, the first Ru layer (64) is formed to a thickness between approximately 5 and 30 angstroms with approximately 10 angstroms being preferred, the Ta layer (66) is formed to a thickness between approximately 10 and 80 angstroms with approximately 60 angstroms being preferred and the second Ru layer (68) is formed to a thickness between approximately 5 and 50 angstroms with approximately 10 angstroms being preferred. This four layer capping layer has been found to improve the GMR ratio and to facilitate processing.

As already noted in the description of the TMR sensor, the magnetostriction properties of the CCP CPP GMR sensor can also be adjusted by varying the thicknesses or Fe percentages of the layers forming the composite free layer. It should, in fact, be noted that Fe percentages between 5% and 90% are permissable in the free and pinned layers and will meet the objects of the invention.

Figure 3:
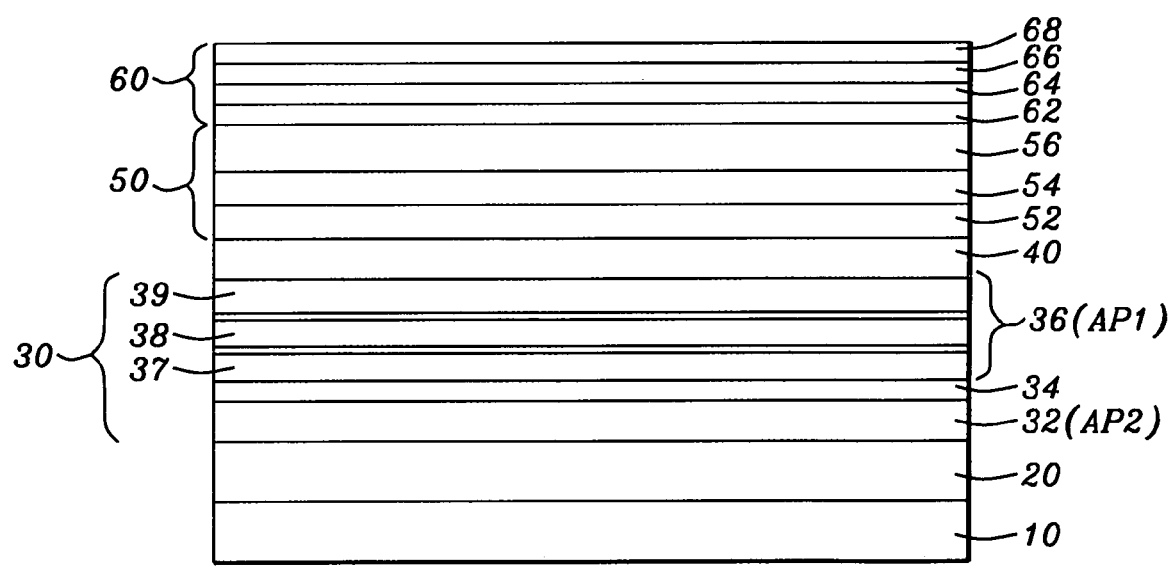
FIG. 3 is a schematic representation of a spin-valve GMR sensor formed in the CPP configuration, without the CCP layer and using the tri-layered free layer of the present invention.

Referring finally to FIG. 3, there is shown a CPP GMR sensor formed in accord with the present invention in which the CCP layer described above is omitted. In all other respects the structure and formation of the CPP GMR sensor without the CCP layer is the same as that illustrated in FIG. 2 and described in the foregoing for the CCP CPP GMR sensor. Layer 44 (CCP layer) of FIG. 2 is not formed and there is only one spacer layer (40), in FIG. 3, replacing the two spacer layers (42) and (46) in FIG. 2. Even without the CCP layer, the composite free layer described above provides improved coercivity, GMR ratio and magnetostriction.

As is understood by a person skilled in the art, the preferred embodiments of the present invention are illustrative of the present invention rather than limiting of the present invention. Revisions and modifications may be made to methods, materials, structures and dimensions employed in forming and providing a TMR, a CPP GMR or a CCP CPP GMR sensor incorporating a tri-layered composite free layer, while still forming and providing such a device and its method of formation in accord with the spirit and scope of the present invention as defined by the appended claims.

What is claimed is:

1. A TMR sensor element having improved free layer coercivity, improved magnetoresistive ratio, low areal resistance and improved magnetostriction properties comprising:
   a seed layer;
   a pinning layer formed on said seed layer;
   a pinned layer formed on said pinning layer and magnetically coupled thereto;
   a tunneling barrier layer formed on said pinned layer;
   a multi-layered composite free layer including at least three magnetic layers formed on said barrier layer;
   a capping layer formed on said free layer.

2. The TMR sensor of claim 1 wherein said multi-layered composite free layer is formed as a lamination of the following three contiguous ferromagnetic layers and includes at least the following sequence:
   a first ferromagnetic material layer that is an alloy including Co and Fe;
   a third ferromagnetic material layer that is an alloy including Ni and Fe;
   a second ferromagnetic material layer, that is an alloy including Co, Fe, and B and wherein said second layer is interposed between said first and third layers.

3. The TMR sensor of claim 2 wherein said first ferromagnetic material layer is an alloy of the form $Co(100-x_1)Fe(x_1)$, said second ferromagnetic material layer is an alloy of the form $Co(100-x_2-y)Fe(x_2)B(y)$ and said third ferromagnetic material layer is an alloy of the form $Ni(100-x_3)Fe(x_3)$ and wherein $x_1$ is between approximately 10% and 90%, $x_2$ is between approximately 5% and 90% and $x_3$ is between approximately 5% and 70% and all are atom percentages of Fe and wherein y is an atom percentage of B and can be between 5% and 30% percent.

4. The TMR sensor of claim 2 wherein the thickness of the first ferromagnetic layer is between 5 and 30 angstroms, the thickness of the second ferromagnetic layer is between 5 and 80 angstroms and the thickness of the third ferromagnetic layer is between 5 and 40 angstroms.

5. The TMR sensor of claim 2 wherein the percentage of Fe by number of atoms in each of said layers is between approximately 5% and 90% and wherein said first layer may contain Ni, B, Nb, and Zr, said second layer may contain Co, B, Nb and Zr and said third layer may contain Ni, Nb and Zr.

6. The TMR sensor of claim 1 wherein said tunneling barrier layer is a layer of Al formed to a thickness between approximately 4 and 8 angstroms and subsequently naturally oxidized to form a layer of AlOx.

7. A method of forming a TMR sensor element having improved free layer coercivity, improved magnetoresistive ratio, low areal resistance and improved magnetostriction properties comprising:
   providing a seed layer;
   forming a pinning layer on said seed layer;
   forming a pinned layer on said pinning layer;

forming a tunneling barrier layer on said pinned layer;
forming a composite, multi-layered free layer on said barrier layer;
forming a capping layer on said free layer;
magnetically coupling said pinning layer to said pinned layer.

8. The method of claim 7 wherein said barrier layer is a layer of AlOx formed by depositing a layer of Al to a thickness between approximately 4 and 8 angstroms and subsequently oxidizing said layer by a process of natural oxidation.

9. The method of claim 7 wherein said multi-layered composite free layer is formed as a tri-layer by a method comprising:
forming a first ferromagnetic layer that includes at least an alloy of Fe and Co;
forming on said first ferromagnetic layer a second ferromagnetic layer that includes at least an alloy of Co, Fe and B;
forming on said second ferromagnetic layer a third ferromagnetic layer that includes at least an alloy of Fe and Ni.

10. The method of claim 9 wherein said first ferromagnetic material layer is an alloy of the form $Co(100-x_1)Fe(x_1)$, said second ferromagnetic material layer is an alloy of the form $Co(100-x_2-y)Fe(x_2)B(y)$ and said third ferromagnetic material layer is an alloy of the form $Ni(100-x_3)Fe(x_3)$ and wherein $x_1$ is between approximately 10% and 90%, $x_2$ is between approximately 5% and 90% and $x_3$ is between approximately 5% and 70% and all are atom percentages of Fe and wherein y is an atom percentage of B and can be between 5% and 30% percent.

11. The method of claim 10 wherein said first ferromagnetic layer is formed to a thickness between approximately 5 and 30 angstroms, wherein said second ferromagnetic layer is formed to a thickness between approximately 5 and 40 angstroms and wherein said third ferromagnetic layer is formed to a thickness between approximately 5 and 80 angstroms.

12. The method of claim 10 wherein the value of the magnetostriction coefficient of said composite free layer is adjusted by the choice of thicknesses of said first, second and third ferromagnetic layers.

13. A CCP CPP GMR sensor having improved coercivity, improved areal resistance, improved GMR ratio and improved magnetostriction properties comprising:
a seed layer;
a pinning layer formed on said seed layer;
a pinned layer formed on said pinning layer and magnetically coupled thereto;
a first conducting, non-magnetic spacer layer formed on said pinned layer;
a CCP layer formed on said first spacer layer;
a second spacer layer formed on said CCP layer;
a composite multi-layer free layer formed on said second spacer layer;
a capping layer formed on said free layer.

14. The GMR sensor of claim 13 wherein said pinned layer is formed as a multi-layered SyAP layer comprising:
a ferromagnetic layer denoted AP2 formed on said pinning layer;
an antiferromagnetically coupling layer formed on said AP2 layer;
a multi-layered ferromagnetic layer denoted AP1 formed on said coupling layer, said AP1 including at least one ferromagnetic layer laminated to a thin, non-magnetic conducting layer.

15. The GMR sensor of claim 13 wherein said CCP layer is a layer of dielectric material in which has been formed a conducting pathway of segregated conducting particles.

16. The GMR sensor of claim 13 wherein said CCP layer is formed as an Al/Cu laminated bi-layer, wherein said Al layer is oxidized to form a layer of AlOx and said layer of Cu is formed into a conducting pathway of segregated particles by a RF PIT process followed by an RF IAO process.

17. The GMR sensor of claim 13 wherein said multi-layered composite free layer is formed as a lamination of the following three contiguous ferromagnetic layers and includes at least the following sequence:
a first ferromagnetic material layer that is an alloy including Co and Fe;
a third ferromagnetic material layer that is an alloy including Ni and Fe;
a second ferromagnetic material layer, that is an alloy including Co, Fe, and B and wherein said second layer is interposed between said first and third layers.

18. The GMR sensor of claim 17 wherein said first ferromagnetic material layer is an alloy of the form $Co(100-x_1)Fe(x_1)$, said second ferromagnetic material layer is an alloy of the form $Co(100-x_2-y)Fe(x_2)B(y)$ and said third ferromagnetic material layer is an alloy of the form $Ni(100-x_3)Fe(x_3)$ and wherein $x_1$ is between approximately 10% and 90%, $x_2$ is between approximately 5% and 90% and $x_3$ is between approximately 5% and 70% and all are atom percentages of Fe and wherein y is an atom percentage of B and can be between 5% and 30% percent.

19. The GMR sensor of claim 18 wherein the thickness of the first ferromagnetic layer is between 5 and 30 angstroms, the thickness of the second ferromagnetic layer is between 5 and 80 angstroms and the thickness of the third ferromagnetic layer is between 5 and 40 angstroms.

20. The GMR sensor of claim 17 wherein the percentage of Fe by number of atoms in each of said layers is between approximately 5% and 90% and wherein said first layer may contain Ni, B, Nb, and Zr, said second layer may contain Co, B, Nb and Zr and said third layer may contain Ni, Nb and Zr.

21. A method of forming a CCP CPP GMR sensor having improved coercivity, improved areal resistance, improved GMR ratio and improved magnetostriction properties comprising:
providing a seed layer;
forming a pinning layer on said seed layer;
forming a pinned layer on said pinning layer;
forming a first conducting, non-magnetic spacer layer on said pinned layer;
forming a CCP layer on said first spacer layer;
forming a second conducting, non-magnetic spacer layer on said CCP layer;
forming a multi-layer composite free layer on said second spacer layer;
forming a capping layer on said free layer;
magnetically coupling said pinning layer to said pinned layer.

22. The method of claim 21 wherein said pinned layer is formed as a multi-layered SyAP layer comprising:
forming a ferromagnetic layer denoted AP2 on said pinning layer;
forming an antiferromagnetically coupling layer on said AP2 layer;

forming a multi-layered ferromagnetic layer denoted AP1 on said coupling layer, said AP1 including at least one ferromagnetic layer laminated to a thin, non-magnetic conducting layer.

23. The method of claim 21 wherein said first and second conducting, non-magnetic spacer layers are layers of Cu, wherein said first spacer layer is formed to a thickness between approximately 5 and 6 angstroms and said second spacer layer is formed to a thickness between approximately 2 and 4 angstroms.

24. The method of claim 21 wherein said CCP layer is a layer of dielectric material in which has been formed a conducting pathway of segregated conducting particles by a method comprising:
forming a bilayer of Al/Cu on said first conducting, non-magnetic spacer layer;
oxidizing said Al portion of said bilayer by a process of RF PIT;
forming segregated Cu particles within said oxidized Al portion by a process of RFIAO; wherein
said RF PIT process comprises a 40 second flow of oxygen at a flow rate of 50 sccm at a power input of 20 watts and said RFIAO process comprises a flow of a mixture of Ar and O at a ratio of 50/0.8 Ar/O for 30 seconds at a power input of 27 watts.

25. The method of claim 21 wherein said multi-layered composite free layer is a tri-layer whose formation comprises:
forming a first ferromagnetic material layer that is an alloy including Co and Fe;
forming on said first ferromagnetic layer a second ferromagnetic material layer, that is an alloy including Co, Fe, and B;
forming on said second ferromagnetic layer a third ferromagnetic material layer that is an alloy including Ni and Fe.

26. The method of claim 24 wherein said first ferromagnetic material layer is an alloy of the form $Co(100-x_1)Fe(x_1)$, said second ferromagnetic material layer is an alloy of the form $Co(100-x_2-y)Fe(x_2)B(y)$ and said third ferromagnetic material layer is an alloy of the form $Ni(100-x_3)Fe(x_3)$ and wherein $x_1$ is between approximately 10% and 90%, $x_2$ is between approximately 5% and 90% and $x_3$ is between approximately 5% and 70% and all are atom percentages of Fe and wherein y is an atom percentage of B and can be between 5% and 30% percent.

27. The method of claim 22 wherein said AP1 layer is at least one layer of CoFe(70%) formed to a thickness between approximately 10 and 13 angstroms on which is laminated a layer of Cu formed to a thickness between approximately 1 and 3 angstroms and wherein $x_1$, $x_2$, and $x_3$ are approximately 70%.

28. The method of claim 26 wherein the thickness of said first ferromagnetic layer is between 2 and 30 angstroms, the thickness of said second ferromagnetic layer is between 5 and 80 angstroms and the thickness of said third ferromagnetic layer is between 5 and 40 angstroms.

29. A CPP GMR sensor having improved coercivity, improved areal resistance, improved GMR ratio and improved magnetostriction properties comprising:
a seed layer;
a pinning layer formed on said seed layer;
a pinned layer formed on said pinning layer and magnetically coupled thereto;
a conducting, non-magnetic spacer layer formed on said pinned layer;
a tri-layer composite free layer formed on said spacer layer;
a capping layer formed on said free layer.

30. The GMR sensor of claim 29 wherein said pinned layer is formed as a multi-layered SyAP layer comprising:
a ferromagnetic layer denoted AP2 formed on said pinning layer;
an antiferromagnetically coupling layer formed on said AP2 layer;
a multi-layered ferromagnetic layer denoted AP1 formed on said coupling layer, said AP1 including at least one ferromagnetic layer laminated to a thin, non-magnetic conducting layer.

31. The GMR sensor of claim 29 wherein said multi-layered composite free layer is formed as a lamination of the following three contiguous ferromagnetic layers and includes at least the following sequence:
a first ferromagnetic material layer that is an alloy including Co and Fe;
a third ferromagnetic material layer that is an alloy including Ni and Fe;
a second ferromagnetic material layer, that is an alloy including Co, Fe, and B and wherein said second layer is interposed between said first and third layers.

32. The GMR sensor of claim 31 wherein said first ferromagnetic material layer is an alloy of the form $Co(100-x_1)Fe(x_1)$, said second ferromagnetic material layer is an alloy of the form $Co(100-x_2-y)Fe(x_2)B(y)$ and said third ferromagnetic material layer is an alloy of the form $Ni(100-x_3)Fe(x_3)$ and wherein $x_1$ is between approximately 10% and 90%, $x_2$ is between approximately 5% and 90% and $x_3$ is between approximately 5% and 70% and all are atom percentages of Fe and wherein y is an atom percentage of B and can be between 5% and 30% percent.

33. The GMR sensor of claim 31 wherein the thickness of the first ferromagnetic layer is between 2 and 30 angstroms, the thickness of the second ferromagnetic layer is between 5 and 80 angstroms and the thickness of the third ferromagnetic layer is between 5 and 40 angstroms.

34. The GMR sensor of claim 31 wherein the percentage of Fe by number of atoms in each of said layers is between approximately 5% and 90% and wherein said first layer may contain Ni, B, Nb, and Zr, said second layer may contain Co, B, Nb and Zr and said third layer may contain Ni, Nb and Zr.

* * * * *